US009680027B2

(12) United States Patent
Oxland et al.

(10) Patent No.: US 9,680,027 B2
(45) Date of Patent: Jun. 13, 2017

(54) NICKELIDE SOURCE/DRAIN STRUCTURES FOR CMOS TRANSISTORS

(75) Inventors: Richard Kenneth Oxland, Leuven (BE); Mark van Dal, Heverlee (BE)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 13/414,437

(22) Filed: Mar. 7, 2012

(65) Prior Publication Data

US 2013/0234205 A1  Sep. 12, 2013

(51) Int. Cl.
| | |
|---|---|
| *H01L 29/78* | (2006.01) |
| *H01L 29/786* | (2006.01) |
| *H01L 29/24* | (2006.01) |
| *H01L 21/84* | (2006.01) |
| *H01L 27/12* | (2006.01) |
| *H01L 29/45* | (2006.01) |

(52) U.S. Cl.
CPC ........ *H01L 29/78681* (2013.01); *H01L 21/84* (2013.01); *H01L 27/1203* (2013.01); *H01L 29/24* (2013.01); *H01L 29/45* (2013.01)

(58) Field of Classification Search
CPC ....................................................... H01L 29/78
USPC ....................................................... 257/192
See application file for complete search history.

(56) References Cited

U.S. PATENT DOCUMENTS

| | | | | |
|---|---|---|---|---|
| 4,855,247 | A * | 8/1989 | Ma et al. ...................... | 438/305 |
| 8,049,253 | B2 * | 11/2011 | Isobe ............................ | 257/288 |
| 8,470,688 | B2 * | 6/2013 | Isobe ............................ | 438/458 |
| 2006/0065914 | A1 * | 3/2006 | Chen et al. ....... H01L 21/26506 257/288 |
| 2007/0138506 | A1 * | 6/2007 | Braddock ...................... | 257/192 |
| 2008/0237636 | A1 * | 10/2008 | Jin et al. ............. H01L 29/1054 257/190 |
| 2008/0283903 | A1 * | 11/2008 | Grabowski et al. ... B82Y 10/00 257/325 |
| 2011/0068348 | A1 | 3/2011 | Passlack | |
| 2011/0101418 | A1 * | 5/2011 | Murthy et al. ................ | 257/190 |
| 2011/0297916 | A1 * | 12/2011 | Bennett et al. ... H01L 21/02398 257/24 |

(Continued)

FOREIGN PATENT DOCUMENTS

CN          1883040 A       12/2006

OTHER PUBLICATIONS

Oxland et al. (Oxland) "An Ultralow-Resistance Utrashallow Metallic Source/Drain Contact Scheme for III-V NMOS" Electron Device Letters, IEEE, Issue Date: Apr. 2012.*

(Continued)

*Primary Examiner* — Mark Prenty
(74) *Attorney, Agent, or Firm* — Duane Morris LLP

(57) ABSTRACT

A nickelide material with reduced resistivity is provided as source/drain contact surfaces in both NMOS and PMOS technology. The nickelide material layer may be a ternary material such as NiInAs, and may be formed from a binary material previously formed in the source/drain regions. The binary material may be the channel material or it may be an epitaxial layer formed over the channel material. The same ternary nickelide material may be used as the source/drain contact surface in both NMOS and PMOS transistors. Various binary or ternary channel materials may be used for the NMOS transistors and for the PMOS transistors.

18 Claims, 6 Drawing Sheets

NMOS

(56) References Cited

U.S. PATENT DOCUMENTS

| | | | |
|---|---|---|---|
| 2012/0012903 A1* | 1/2012 | Nieh et al. | 257/288 |
| 2012/0231632 A1* | 9/2012 | Takahashi et al. | 438/754 |
| 2013/0122701 A1* | 5/2013 | Krupa et al. | 438/663 |
| 2013/0157450 A1* | 6/2013 | Fitz et al. | 438/586 |
| 2013/0299895 A1* | 11/2013 | Oxland et al. | 257/329 |
| 2014/0008699 A1* | 1/2014 | Oxland | 257/192 |
| 2014/0073140 A1* | 3/2014 | Takahashi et al. | 438/754 |
| 2014/0293683 A1* | 10/2014 | Majima et al. | 365/158 |

OTHER PUBLICATIONS

Kim et al. (Kim) "Self-aligned metal Source/Drain InXGa1-XAs n-MOSFETs using Ni—InGaAs alloy" IEEE 2010, p. 26.6.1-26.6.4.*

Self-aligned metal Source/Drain InxGa1-xAs n-MOSFETs using Ni—InGaAs alloy, S.H. Kim, M. Yokoyama, N. Taoka, R. Iida, S. Lee, R. Nakane, Y. Urabe, N. Miyata, T. Yasuda, H. Yamada, N. Fukuhara, M. Hata, M. Takenaka, S. Takagi, 2010 IEEE International Electron Devices Meeting, Dec. 6-8, 2010, pp. 26.6.1-26.6.4.

Simulation of Electron Transport in High-Mobility MOSFETs: Density of States Bottleneck and Source Starvation, M.V. Fischetti, L. Wang, B. Yu, C. Sachs, P.M. Asbeck, Y. Taur and M. Rodwell, 2007 IEEE International Electron Devices Meeting, Dec. 10-12, 2007, pp. 109-112.

Self-aligned meal source/drain InP n-metal-oxide-semicondcutor field-effect transistors using Ni—InP metallic alloy, Sanghyeon Kim, Masafumi Yokoyama, Noriyuki Miyata, Tetsuji Yasuda, Hisashi Yamada, N. Fukuhara, M. Hata, M. Takenaka and S. Takagi, 2011 American Institute of Physics, published online Jun. 13, 2011.

Oxland et al., "An Ultralow-Resistance Ultrashallow Metallic Source/Drain Contact Scheme for III-V NMOS," IEEE Electron Device Letters, Apr. 2012, 33(4):501-503.

Office Action dated Jan. 22, 2014, in corresponding Korean Patent Application No. 10-2013-0021957 (translation included), 11 total pages.

* cited by examiner

NICKELIDE SOURCE/DRAIN STRUCTURES FOR CMOS TRANSISTORS

TECHNICAL FIELD

The disclosure relates to semiconductor devices with improved source/drain contact areas, and methods for manufacturing the same.

BACKGROUND

In today's rapidly advancing world of semiconductor manufacturing, integration levels are increasing, device features are becoming smaller and greater demands are being made for improved device performance. As CMOS, complementary metal oxide semiconductor, devices are scaled to smaller sizes for future technologies, new materials and concepts are necessary to meet the advanced performance requirements.

CMOS technology includes NMOS (N-type metal oxide semiconductor) and PMOS (P-type metal oxide semiconductor) devices formed on the same substrate and in the same die. A critical aspect of high performance in NMOS and PMOS and various other devices is device speed. For devices to operate at high speeds, it is necessary to have a very low resistance, including a very low contact resistance between metal interconnect structures and the NMOS and PMOS transistors. Contact is made to the gate electrodes of the respective transistors as well as to both the source and drain regions of the associated transistors. One approach to provide a low contact resistance is to utilize source/drain extension regions that are implanted with dopant impurities that reduce resistance. After dopant impurities are introduced, however, they are activated using high temperature activation processes and the thermal dopant activation processes are inefficient for the materials being used as channel materials in advanced technologies.

BRIEF DESCRIPTION OF THE DRAWING

The present disclosure is best understood from the following detailed description when read in conjunction with the accompanying drawing. It is emphasized that, according to common practice, the various features of the drawing are not necessarily to scale. On the contrary, the dimensions of the various features are arbitrarily expanded or reduced for clarity. Like numerals denote like features throughout the specification and drawing.

DETAILED DESCRIPTION

The disclosure provides a low resistivity contact scheme for providing contact to NMOS and PMOS transistors. In some embodiments, the contact material is a metal-semiconductor ternary material with low resistivity and which is thermodynamically stable when contacting semiconductor materials. The contact material may be a nickelide layer which is a mono-crystalline material after thermal annealing and may be used as source/drain regions or source/drain extension regions. The same nickelide material may be used for both NMOS and PMOS transistors. The mono-crystalline phase provides controllable lateral diffusion so that the contact scheme is highly scalable and the nickelide material forms a smooth, sharp interface with the channel material as spiking between the materials is avoided. The nickelide material provides a reduced resistance on the order of 100-200 ohm/sq. in one embodiment.

In addition to the nickelide material formed from nickel and described throughout the disclosure, other metals are used in other embodiments. In some embodiments, platinum or palladium are used and in still other embodiments, other suitable metal materials that form thermodynamically stable ternary phases, are used.

Figures 1A, 1B:
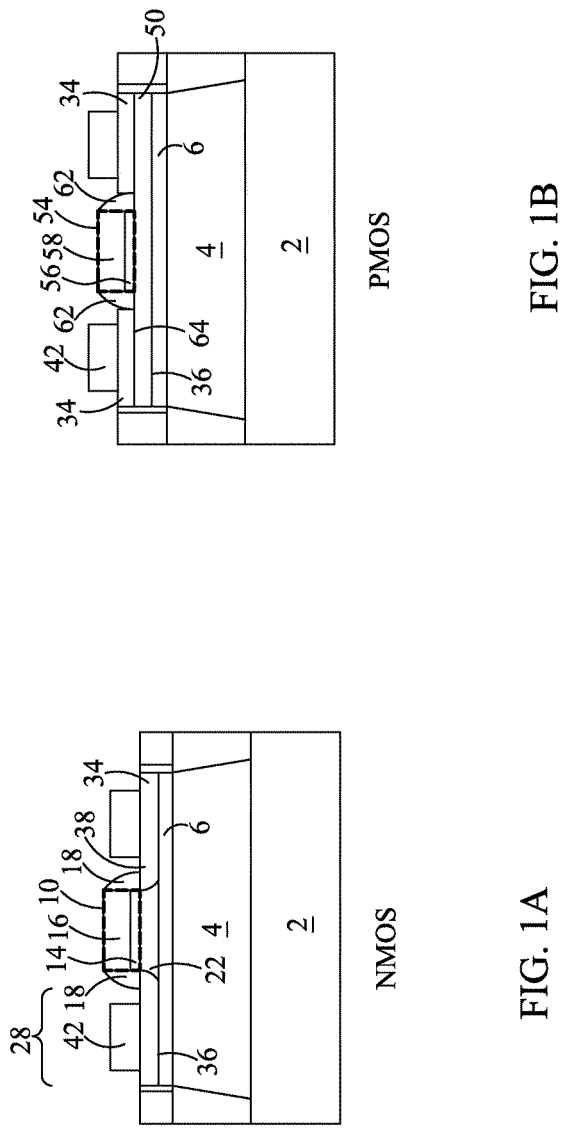
FIG. 1A is a cross-sectional view of an embodiment of an NMOS transistor structure according to the disclosure.
FIG. 1B is a cross-sectional view of an embodiment of an PMOS transistor structure according to the disclosure.

FIGS. 1A and 1B illustrate an embodiment of an NMOS transistor structure and a PMOS transistor structure, respectively, according to the disclosure. Referring to both FIGS. 1A and 1B, each respective transistor structure is formed over substrate 2 which may be a semiconductor substrate such as silicon or silicon germanium or other suitable semiconductor or other materials. Buffer layer 4 is disposed over substrate 2 and may be a III-V buffer layer in one embodiment but other suitable buffer layers may be used in other embodiments. In some embodiments, a III-V buffer layer is understood to signify a buffer layer is formed of a combination of materials including materials from groups III (B, Al, Ga, In, Tl, Uut) and V (N, P, As, Sb, Bi, Uup) of the periodic table of elements. Isolator layer 6 is disposed over buffer layer 4. Various suitable isolator materials such as but not limited to CdTeSe, ZnSeTe, MgSeTe, InAlAs and AlAsSb may be used as isolator layer 6 in various embodiments. In other embodiments, isolator layer 6 is a buried dielectric material.

FIG. 1A shows NMOS transistor gate structure 10. Gate electrode 16 and gate dielectric 14 combine to form NMOS transistor gate structure 10, indicated by the dashed line. Opposed spacers 18 are formed adjacent opposed sides of gate electrode 16 and gate dielectric 14 that form NMOS transistor gate structure 10. In some embodiments, spacers are not used. Gate dielectric 14 may be a high-k dielectric material but other suitable dielectric materials may be used in other embodiments. Gate electrode 16 may be formed of various suitable gate materials such as polysilicon or other suitable semiconductor or metal materials. Spacers 18 may be formed of oxides, nitrides, oxynitrides, combinations thereof and other suitable insulating materials.

NMOS transistor gate structure 10 includes gate electrode 16 and gate dielectric 14 formed over NMOS channel material 22 and defines the gate region. NMOS channel material 22 is at least a binary material and may be a ternary material in various embodiments. According to one embodiment, NMOS channel material 22 may be $In_xGa_{(1-x)}As$ with x>0.7 although other suitable binary or ternary NMOS channel materials may be used in other embodiments. According to the embodiment in which NMOS channel material 22 is $In_xGa_{(1-x)}$ As and x=1.0, NMOS channel material 22 is InAs. Source/drain regions 28 are disposed laterally adjacent NMOS transistor gate structure 10 and include source/drain material 34. Source/drain material 34 is beneath surface 38 upon which gate dielectric 14 is formed and extends downwardly to top surface 36 of isolator layer 6. In various embodiments, source/drain material 34 may be a nickelide material such as NiInP, NiInAs, and NiInSb but such are examples only and in other embodiments, other suitable ternary nickelide materials or other suitable metal semiconductor ternary materials may be used as source/drain material 34. Metal contact structure 42 is coupled to source/drain material 34 and various suitable low resistivity conductive metals such as copper, aluminum or their alloys or various other metals, may be used as metal contact structure 42. Source/drain material 34 is a low-resistance material as described above, and may include a resistance ranging from about 100 to 200 Ohms/sq. in some embodiments.

In some embodiments, extension dielectrics may be formed laterally adjacent gate structure 10 and beneath spacers 18. In one embodiment, the extension dielectrics (not shown in FIG. 1A) may be formed on surface 38 of source/drain material 34 adjacent NMOS channel transistor gate structure 10. In some embodiments, the extension dielectric is a suitable oxide or other insulating material that creates a high defectivity interface with the underlying material. In some embodiments, the extension dielectric described in United States Patent Application Publication U.S. 2011/0068348 A1 is used. The contents of United States Patent Application Publication U.S. 2011/0068348 A1 are incorporated by reference as if set forth in their entirety.

Now turning to FIG. 1B, PMOS channel material 50 is formed over top surface 36 of isolator layer 6. PMOS channel material 50 may be $In_yGa_{(1-y)}Sb$, with 0<y<1 in one embodiment but various other suitable binary or ternary materials may be used as PMOS channel material 50 in other embodiments. In some embodiments, PMOS channel material 50 may be InSb or GaSb. Gate dielectric 56 and gate electrode 58 form PMOS transistor gate structure 54, indicated by the dashed line. Opposed spacers 62 are disposed along opposed sides of gate dielectric 56 and gate electrode 58 of the PMOS transistor gate structure. In some embodiments, spacers 62 are not used. Spacers 62 may be formed of oxides, nitrides, oxynitrides, combinations thereof or other suitable insulating materials. Gate dielectric 56 may be a high-k gate dielectric material or other suitable gate dielectric materials and gate electrode 58 may be formed of polysilicon or other suitable semiconductor material. Source/drain material 34 may be a nickelide material. In various embodiments, nickelide materials such as NiInP, NiInAs, and NiInSb may be used but such are illustrative of some embodiments only. In other embodiments, other suitable ternary nickelide materials or other suitable metal semiconductor ternary materials, are used as source/drain material 34. Metal contact structure 42 is as described above. In the PMOS transistor illustrated in FIG. 1B, source/drain material 34 is disposed over top surface 64 of PMOS channel material 50. Gate dielectric 56 is formed over top surface 64 of PMOS channel material 50.

Figure 2:
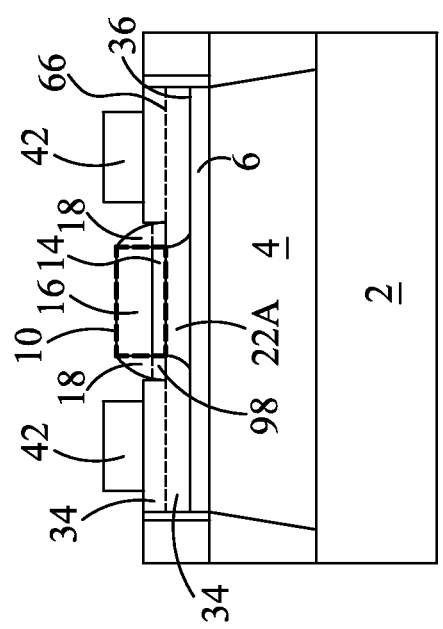
FIG. 2 is a cross-sectional view showing another embodiment of an NMOS transistor structure according to the disclosure.

FIG. 2 is another embodiment of an NMOS transistor and in which like features are as described above. In the embodiment of FIG. 2, source/drain material 34 extends both above and below dashed line 66 which represents the original surface over which gate dielectric 14 is disposed. The portions of source/drain material 34 above dashed line 66 may be formed from an epitaxial layer formed over an initial layer of NMOS channel material 22A as will be described in further detail below. FIG. 2 also shows another aspect of the disclosure in which lower portion 98 (indicated by the dashed line) of spacers 18 is formed of a different material and is an extension dielectric. The extension dielectric may be a Fermi level pinning oxide spacer in one embodiment and is formed of a suitable oxide or other insulating material that creates a high defectivity interface with the underlying material, as described above. In some embodiments, the extension dielectric 98 is as described in United States Patent Application Publication U.S. 2001/0068348 A1.

FIG. 2 also illustrates another aspect of the disclosure. In FIG. 2, NMOS channel material 22A extends laterally past the lateral edges of NMOS channel transistor gate structure 10. This is achieved by controlling the nickelide formation reaction so that the nickelide does not consume the source/drain material and completely encroach the channel material all the way to NMOS channel transistor gate structure 10 as according to the NMOS embodiment of FIG. 1A. The nickelide formation process is described in conjunction with FIG. 4C.

Figure 3:
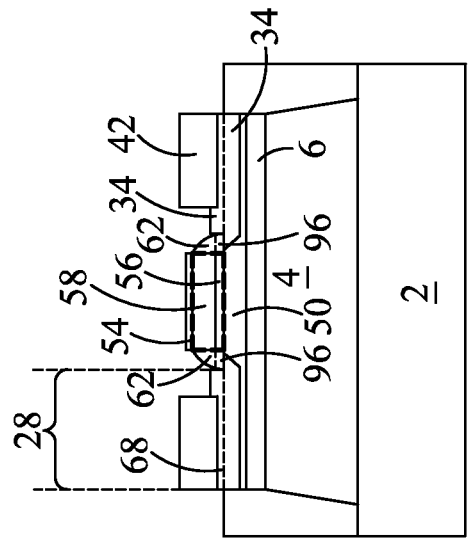
FIG. 3 is a cross-sectional view showing another embodiment of a PMOS transistor structure according to the disclosure.

FIG. 3 shows another embodiment of a PMOS transistor according to the disclosure. In the embodiment illustrated in FIG. 3, source/drain material 34 extends both above and below original surface 68 upon which gate dielectric 56 is formed. PMOS channel material 50 includes a reduced thickness in source/drain areas 28. According to the PMOS embodiment, spacers 62 may include lower portions 96 (indicated by the dashed line) that is an extension dielectric formed of a suitable oxide or other insulating material that creates a high defectivity interface with the underlying material. The extension dielectric may be Fermi level pinning oxide spacer such as described above. In another embodiment, the entire spacer 62 may be a Fermi level pinning oxide spacer such as the extension dielectric formed of a suitable oxide or other insulating material that creates a high defectivity interface with the underlying material. In still another embodiment, spacers 62 are not used.

Figure 4B:
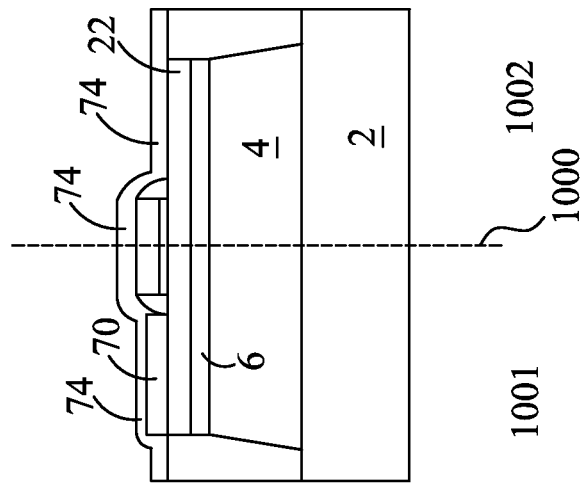
FIGS. 4A-4C are cross-sectional views illustrating a sequence of processing operations used to form embodiments of an NMOS transistor structure according to an embodiment of the disclosure.
Figure 4A:
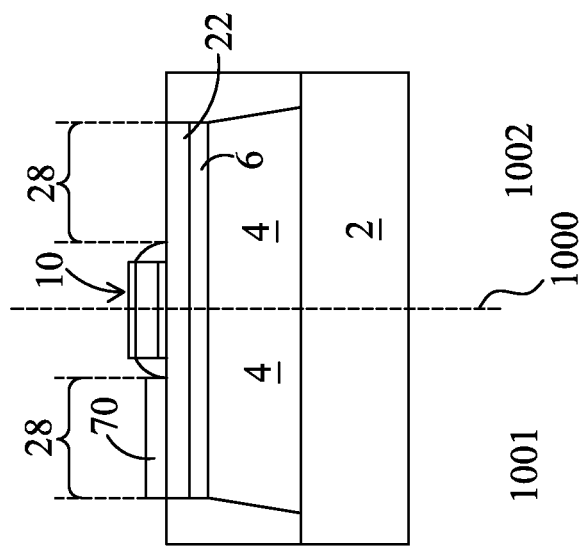

FIG. 4A shows a structure with two embodiments of an NMOS transistor illustrated on the same structure for brevity of description purposes only. FIG. 4A shows the first step in a sequence of processing operations used to form the two embodiments according to the disclosure. First embodiment 1001 appears on the left-hand side of dashed line 1000 and utilizes an epitaxial layer formed over NMOS channel material 22. Second embodiment 1002 appears on the right-hand side of dashed line 1000 and does not utilize the epitaxial layer of first embodiment 1001. FIG. 4A illustrates both embodiments on the same structure and it should be understood that according to one embodiment, an NMOS transistor may be fabricated such that both of its opposed source/drain regions include an additional epitaxial layer such as illustrated in first embodiment 1001. According to another embodiment, an NMOS transistor may be fabricated such that neither of its source/drain regions includes the additional epitaxial layer and both source/drain regions may be fabricated according to second embodiment 1002.

Like numerals denote like features throughout the specification and NMOS channel material 22, as described above, is disposed over isolator layer 6. In first embodiment 1001, additional epitaxial layer 70 is formed over NMOS channel material 22. Selective epitaxial growth or deposition can be used to form epitaxial layer 70 in source/drain regions 28. Epitaxial layer 70 may include a thickness of about 5-50 nm according to some embodiments and may be InAs in one embodiment. In other embodiments, epitaxial layer 70 may be formed of InP, InSb or other suitable binary materials.

FIG. 4B shows both embodiments of FIG. 4A after nickel layer 74 is formed over the structure of FIG. 4A according to one embodiment. Various thicknesses may be used. In some embodiments, nickel layer 74 may include a thickness ranging from about 5 nm to about 200 nm. According to first embodiment 1001, nickel layer 74 will be formed to include sufficient thickness to react with all of epitaxial layer 70 and form a nickelide material by combination with epitaxial material 70. According to second embodiment 1002, which does not include epitaxial layer 70, nickel layer 74 is formed with sufficient thickness to react with all of NMOS channel material 22. Various deposition methods such as sputtering, evaporation or other physical vapor deposition (PVD) methods may be used to form nickel layer 74.

Figure 4C:
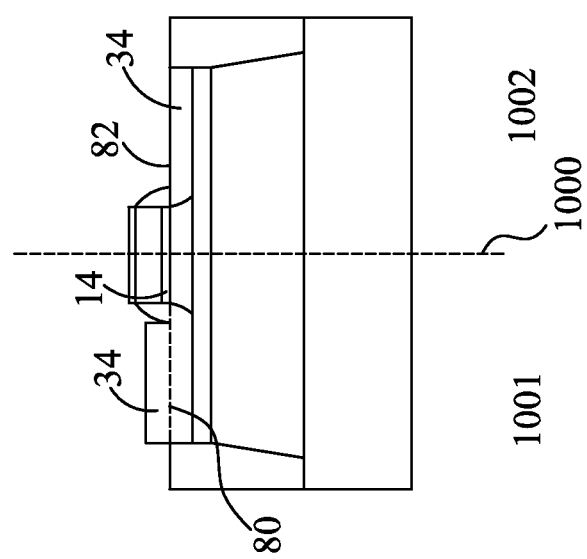

FIG. 4C shows both embodiments shown in FIG. 4B after a thermal annealing operation has been carried out. The thermal annealing causes reaction to form a ternary nickelide material. The annealing operation can be a one step operation or a multi-step operation. According to one embodiment, a two-step annealing process is used with the first step being a lower temperature step causing diffusion of the nickel metal into the underlying semiconductor material. After the first annealing step, a selective etching operation may optionally be used to remove unreacted nickel. A second annealing operation of the two-step annealing operation is carried out at higher temperature and forms a thermodynamically stable ternary material that includes low resistance as described above. In one embodiment, the first step of the annealing operation may be carried out within a temperature range of 275-325° C. and the second step of the two-step annealing operation may include a temperature in the range of 325-450° C.

According to both first embodiment 1001 and second embodiment 1002, the nickel from nickel layer 74 advantageously reacts with a binary material to form a ternary nickelide material that serves as source/drain material 34. In either embodiment, after the annealing operation is carried out, the unreacted nickel is removed using a selective etching operation.

In first embodiment 1001, epitaxial layer 70 may be InAs, a binary material, and nickel from nickel layer 74 reacts with the binary material of epitaxial layer 70 such that source/drain material 34 is a nickelide material. The nickelide material of source/drain material 34 will be NiInAs according to this embodiment, but in other embodiments, source/drain material 34 may be NiInP or NiInSb or other nickelide materials. According to the second embodiment 1002, the annealing operation causes reaction between nickel and NMOS channel material 22 which may be a binary material in some embodiments. In one embodiment, NMOS channel material 22 may be InAs, i.e. according to the embodiment in which NMOS channel material 22 is $In_xGa_{(1-x)}As$ with x=1.0. According to this embodiment, the nickel from nickel layer 74 reacts with NMOS channel material 22 to form a nickelide material, i.e. source/drain material 34, during the annealing operation. In second embodiment 1002, source/drain material 34 is below surface 82 upon which gate dielectric 14 is formed. In first embodiment 1001, source/drain material 34 is formed both above and below surface 82, indicated by dashed line 80 in first embodiment 1001.

Metal contact structure 42 may then be formed using various means to provide contact to the respective source/drain materials 34 shown in the two embodiments illustrated in FIG. 4C. With source/drain material 34 being a low resistivity nickelide material, the contact resistance between metal contact structure 42 and the transistor channel, is minimized.

Figure 5A:
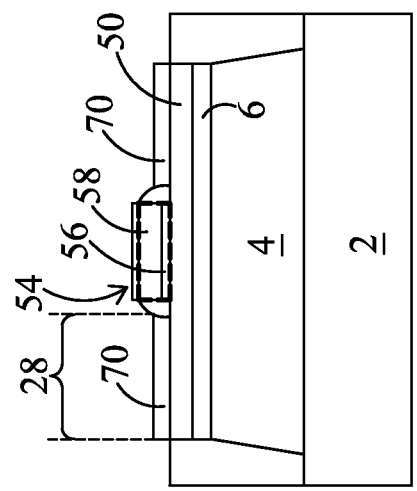
FIGS. 5A-5C are cross-sectional views illustrating a sequence of processing operations used to form a PMOS transistor structure according to an embodiment of the disclosure.

FIG. 5A shows an embodiment of a PMOS transistor structure, many features of which were described in conjunction with FIG. 1B. PMOS channel material 50 is formed beneath PMOS transistor gate structure 54, indicated by the dashed lines, and also in source/drain regions 28. Epitaxial layer 70 is formed over PMOS channel material 50 in source/drain regions 28. According to an embodiment in which both NMOS and PMOS transistors are formed over a substrate such as in the same die, the same epitaxial layer 70 may be used in the source/drain regions of both the NMOS and PMOS transistors. Epitaxial layer 70 is as described above and may be formed of InAs in one embodiment.

Figure 5C:
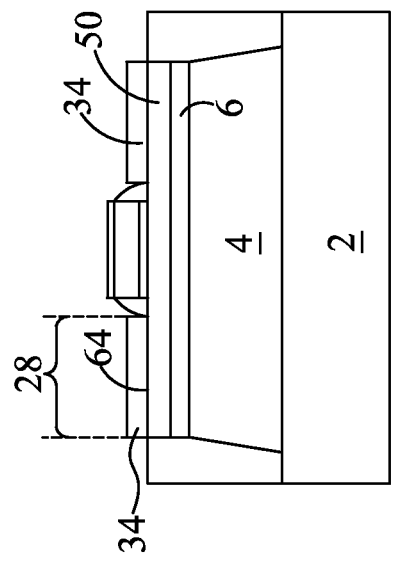
Figure 5B:
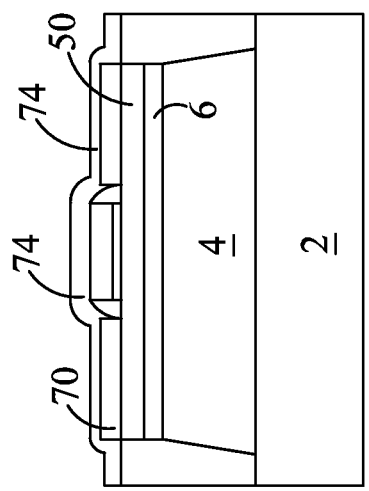

FIG. 5B shows the structure of FIG. 5A after an embodiment in which nickel layer 74 is formed over the structure as described above. Nickel layer 74 is formed with sufficient thickness to react with all of epitaxial layer 70. An annealing operation is carried out upon the structure shown in FIG. 5B to form source/drain material 34 which is nickelide material, in source/drain regions 28. A selective etching operation is then used to remove the unreacted nickel from nickel layer 74 to form the structure of FIG. 5C. The annealing operation may be a one-step or multi-step annealing operation as described above. Source/drain material 34 is formed over top surface 64 of PMOS channel material 50. After the structure in FIG. 5C is formed, contact metal structures such as metal contact structure 42 shown in FIG. 1B, may be formed to provide contact to source/drain material 34.

Figure 6B:
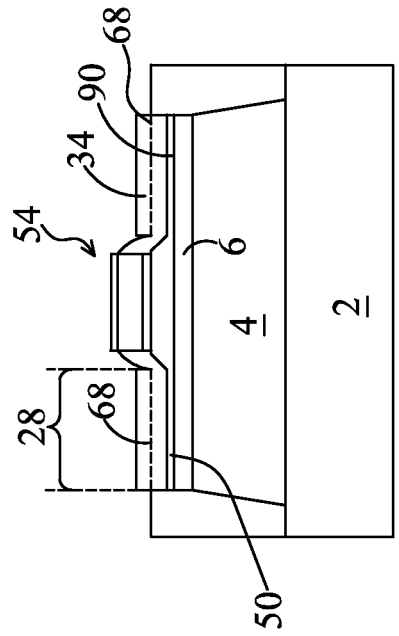
FIGS. 6A-6B are cross-sectional views showing a sequence of processing operations used to form another embodiment of a PMOS transistor structure according to the disclosure.
Figure 6A:
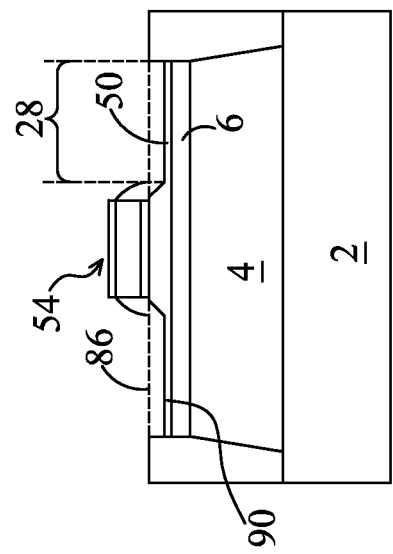

FIG. 6A illustrates the first of two steps in a sequence of processing operations used to form another embodiment of a PMOS transistor according to the disclosure. According to the illustrated embodiment, PMOS channel material 50 is initially formed to extend up to dashed line 86 and then a recessing operation such as an etching operation is used to recess portions of PMOS channel material 50 not 20 covered by PMOS transistor gate structure 54, i.e. in source/drain regions 28. Various etching operations may be used. PMOS channel material 50 is completely removed from source/drain regions 28 in some embodiments. In other embodiments, recessed portion 90 of reduced thickness remains. An epitaxial layer such as epitaxial layer 70 shown in FIG. 5A may then be formed in source/drain regions 28 of FIG. 6A, in particular on recessed portions 90 of PMOS channel material 50. The epitaxial layer may be formed to include a thickness that may range from about 5 nm to about 200 nm in various embodiments. A nickel layer such as nickel layer 74 shown in FIG. 5B may be formed over the structure, then annealed. The unreacted nickel is then removed using a selective etching operation to produce the structure shown in FIG. 6B. FIG. 6B shows source/drain material 34 formed over PMOS channel material 50 in source/drain regions 28. Source/drain material 34 is a ternary nickelide material in this embodiment and FIG. 6B illustrates that according to this embodiment, source/drain material 34 is disposed both above and below dashed line 68 which was the original upper surface of PMOS channel material 50. Metal contact structures 42 may be formed over source/drain material 34 to provide contact to the nickelide material in source/drain regions 28, according to various methods.

According to one aspect, provided is a semiconductor device comprising a transistor including a channel material being at least a binary material and source/drain regions comprising ternary nickelide materials.

According to another aspect, a method for forming a semiconductor device is provided. The method includes:

forming a channel material over a substrate, the channel material comprising at least a binary material; forming a transistor gate structure over the channel material in a gate region, the transistor gate structure including a gate electrode disposed over a dielectric; depositing a nickel layer at least over the channel material in source/drain areas adjacent and not covered by the transistor gate structure; and annealing to form a nickelide in the source/drain areas.

According to another aspect, a method for forming a CMOS semiconductor device is provided. The method includes: forming an NMOS channel material over a substrate in an NMOS region and forming a PMOS channel material over said substrate in a PMOS region, the NMOS channel material and PMOS channel material each being a ternary material. The method further includes: forming an NMOS transistor gate structure over the NMOS channel material in an NMOS gate region and forming a PMOS transistor gate structure over the PMOS channel material in a PMOS gate region; forming a binary source/drain material over the NMOS channel material in NMOS source/drain regions adjacent the NMOS gate structure and over the PMOS channel material in PMOS source/drain regions adjacent the PMOS gate structure; depositing a nickel layer over the PMOS and NMOS regions; and annealing to form a nickelide material in the NMOS source/drain regions and in the PMOS source/drain regions, the nickelide material comprising a ternary material of nickel from the nickel layer and components of the binary source/drain material.

The illustrated embodiments have been described according to the embodiment in which a thermodynamically stable ternary nickelide material is utilized. In other embodiments, metal materials other than nickel and which produce thermodynamically stable ternary compounds may be used. In still other embodiments, the metal layer formed over the binary channel material may include two metals. In one embodiment, nickel and a small amount of another material such as Pd or Pt are used. According to this embodiment, instead of a ternary nickelide material being formed, a quaternary compound including nickel, the components from the binary channel material and the additional metal element is formed. According to yet another embodiment, the channel material includes three elements. According to one embodiment, a small amount of a third element is present. In these embodiments, the annealing process with a nickel or other film, forms a quaternary compound. One embodiment involves the channel material being InGaAs, a nickel film formed over the channel material and the quaternary metallic compound of NiGaInAs materials formed and the amount of the fourth element, in this case Ga, chosen so that the quaternary compound formed according to the annealing process is thermodynamically stable.

The preceding merely illustrates the principles of the disclosure. It will thus be appreciated that those of ordinary skill in the art will be able to devise various arrangements which, although not explicitly described or shown herein, embody the principles of the disclosure and are included within its spirit and scope. Furthermore, all examples and conditional language recited herein are principally intended expressly to be only for pedagogical purposes and to aid in understanding the principles of the disclosure and the concepts contributed to furthering the art, and are to be construed as being without limitation to such specifically recited examples and conditions. Moreover, all statements herein reciting principles, aspects, and embodiments of the disclosure, as well as specific examples thereof, are intended to encompass both structural and functional equivalents thereof. Additionally, it is intended that such equivalents include both currently known equivalents and equivalents developed in the future, i.e., any elements developed that perform the same function, regardless of structure.

This description of the embodiments is intended to be read in connection with the figures of the accompanying drawing, which are to be considered part of the entire written description. In the description, relative terms such as "lower," "upper," "horizontal," "vertical," "above," "below," "up," "down," "top" and "bottom" as well as derivatives thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

Although the disclosure has been described in terms of embodiments, it is not limited thereto. Rather, the appended claims should be construed broadly, to include other variants and embodiments of the disclosure, which may be made by those of ordinary skill in the art without departing from the scope and range of equivalents of the disclosure.

What is claimed is:

1. A semiconductor device comprising a transistor including a channel material being at least a binary material and source/drain regions comprising ternary nickelide materials, wherein said transistor includes a gate structure having a gate electrode and gate dielectric disposed on a surface, and spacers disposed between said gate electrode and said source/drain regions, said spacers including an upper portion formed of a first material and a lower portion formed of a different material, and said ternary nickelide materials are disposed below said surface and further disposed at least partially above said surface.

2. The semiconductor device as in claim 1, wherein said transistor is an NMOS transistor and said channel material is $In_xGa_{(1-x)}As$, with x>0.7.

3. The semiconductor device as in claim 1, wherein said transistor comprises a PMOS transistor and said channel material is $In_yGa_{(1-y)}Sb$, with 0<y<1.

4. The semiconductor device as in claim 1, wherein said ternary nickelide materials comprise NiInAs.

5. The semiconductor device as in claim 4, further comprising a further transistor being an NMOS transistor in which said channel material comprises $In_xGa_{(1-x)}As$ with x>0.7.

6. The semiconductor device as in claim 1, wherein said channel material is disposed over an isolation layer disposed over a III-V buffer layer, said isolation layer comprising one of CdTeSe, ZnSeTe, MgSeTe, AlAsSb, InAlAs and a buried dielectric layer.

7. The semiconductor device as in claim 1, wherein said ternary nickelide materials comprise one of NiInSb and NiInP.

8. The semiconductor device as in claim 1, wherein said transistor comprises an NMOS transistor, said channel material is $In_xGa_{(1-x)}As$, with x>0.7, and wherein said ternary nickelide materials extend below said spacers.

9. The semiconductor device as in claim 4, wherein said transistor is an NMOS transistor.

10. A semiconductor transistor comprising:
a gate structure including a gate electrode over a gate dielectric disposed over a transistor channel;
said transistor channel including an uppermost channel layer of binary material over an isolation material over a semiconductor substrate; and
source/drain regions disposed adjacent said gate structure and each formed of a ternary nickelide comprising one of NiInSb and NiInP, wherein said source/drain regions extend above a top surface of said uppermost channel layer and further extend below the top surface of said uppermost channel layer.

11. The semiconductor device as in claim 10, wherein said transistor is an NMOS transistor.

12. The semiconductor device as in claim 11, further comprising a further transistor being an NMOS transistor with a channel material comprising $In_xGa_{(1-x)}As$ with x>0.7.

13. The semiconductor device as in claim 10, wherein isolation layer is disposed over a III-V buffer layer, said isolation layer comprising one of CdTeSe, ZnSeTe, MgSeTe, AlAsSb, InAlAs and a buried dielectric layer.

14. The semiconductor device as in claim 10, wherein said nickelide comprises NiInP.

15. The semiconductor device as in claim 10, wherein said isolation layer comprises one of CdTeSe, ZnSeTe, MgSeTe, AlAsSb, and InAlAs.

16. A semiconductor device comprising a transistor including a channel material being at least a binary material and source/drain regions comprising ternary nickelide materials, wherein said transistor includes a gate structure having a gate electrode and gate dielectric disposed on a surface, and spacers disposed between said gate electrode and said source/drain regions, said spacers including an upper portion formed of one material and a lower portion formed of a different material, and said ternary nickelide materials comprise one of NiInSb and NiInP, and are disposed below said surface.

17. The semiconductor device as in claim 16, wherein said ternary nickelide materials comprise NiInSb.

18. The semiconductor device as in claim 16, wherein said source/drain regions further extend above said surface.

* * * * *